US010852636B2

(12) United States Patent
Jung et al.

(10) Patent No.: US 10,852,636 B2
(45) Date of Patent: Dec. 1, 2020

(54) METHOD OF DESIGNING LAYOUT OF PHOTOMASK AND METHOD OF MANUFACTURING PHOTOMASK

(71) Applicant: SAMSUNG ELECTRONICS CO., LTD., Suwon-si (KR)

(72) Inventors: Yong-Seok Jung, Seoul (KR); Sung-Hoon Park, Hwaseong-si (KR); Jong-Su Kim, Seoul (KR); Suk-Jong Bae, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 268 days.

(21) Appl. No.: 15/938,434

(22) Filed: Mar. 28, 2018

(65) Prior Publication Data

US 2019/0113838 A1 Apr. 18, 2019

(30) Foreign Application Priority Data

Oct. 12, 2017 (KR) .................. 10-2017-0132241

(51) Int. Cl.
G03F 1/36 (2012.01)
G06F 30/398 (2020.01)
(52) U.S. Cl.
CPC .............. *G03F 1/36* (2013.01); *G06F 30/398* (2020.01)
(58) Field of Classification Search
CPC ........................................................ G03F 1/36

USPC .............................................................. 430/5
See application file for complete search history.

(56) References Cited

U.S. PATENT DOCUMENTS

| 8,056,032 | B2 | 11/2011 | Lee et al. |
| 8,555,211 | B2 | 10/2013 | Jou et al. |
| 9,311,443 | B2 | 4/2016 | Chidambarrao et al. |
| 9,588,413 | B2 | 3/2017 | Kim et al. |
| 9,625,809 | B2 | 4/2017 | Fujimura et al. |
| 9,645,488 | B2 | 5/2017 | Inoue |
| 2017/0082921 | A1 | 3/2017 | Kim et al. |

FOREIGN PATENT DOCUMENTS

| JP | 5538591 B2 | 7/2014 |
| JP | 2015-062054 A | 4/2015 |
| JP | 2016-035542 A | 3/2016 |
| KR | 10-2017-0035207 | 3/2017 |

*Primary Examiner* — Christopher G Young
(74) *Attorney, Agent, or Firm* — Lee IP Law, P.C.

(57) ABSTRACT

A method of designing a layout of a photomask and a method of manufacturing a photomask, the method of designing a layout of a photomask including obtaining a design layout of a mask pattern; performing an optical proximity correction on the design layout to obtain design data; obtaining data of a position error of a pattern occurring during an exposure of the photomask according to the design data; correcting position data of the pattern based on the position error data to correct the design data; and providing the corrected position data to an exposure device to expose an exposure beam according to the corrected design data.

9 Claims, 6 Drawing Sheets

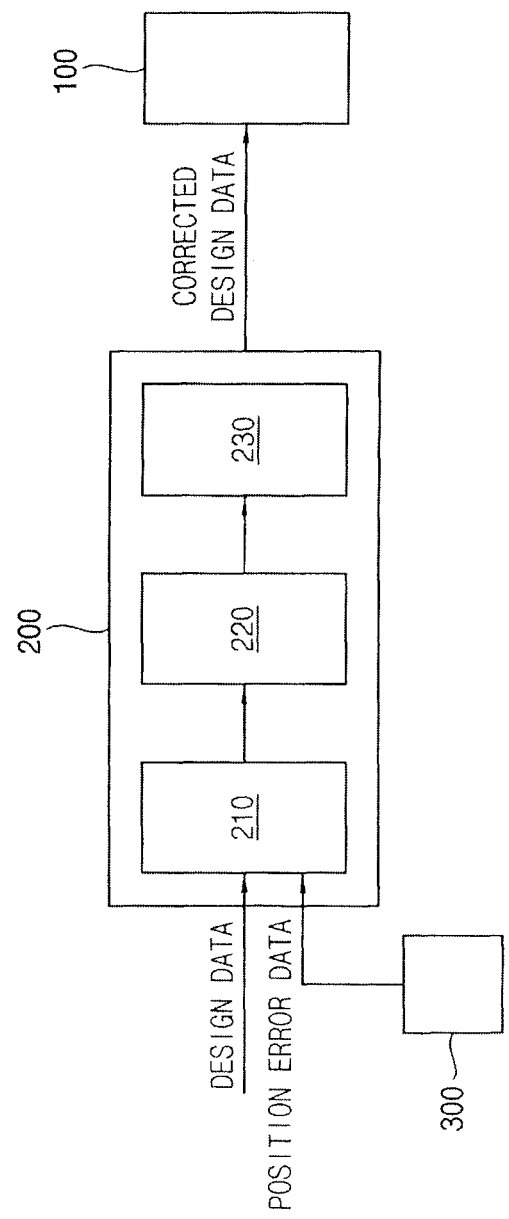

50

52

METHOD OF DESIGNING LAYOUT OF PHOTOMASK AND METHOD OF MANUFACTURING PHOTOMASK

CROSS-REFERENCE TO RELATED APPLICATION

Korean Patent Application No. 10-2017-0132241, filed on Oct. 12, 2017, in the Korean Intellectual Property Office, and entitled: "Method of Designing Layout of Photomask and Method of Manufacturing Photomask," is incorporated by reference herein in its entirety.

BACKGROUND

1. Field

Embodiments relate to a method of designing a layout of a photomask and a method of manufacturing a photomask.

2. Description of the Related Art

Recently, as design rules of semiconductor devices have become smaller, a higher degree of precision may be needed for a photomask.

SUMMARY

The embodiments may be realized by providing a method of designing a layout of a photomask, the method including obtaining a design layout of a mask pattern; performing an optical proximity correction on the design layout to obtain design data; obtaining data of a position error of a pattern occurring during an exposure of the photomask according to the design data; correcting position data of the pattern based on the position error data to correct the design data; and providing the corrected position data to an exposure device to expose an exposure beam according to the corrected design data.

The embodiments may be realized by providing a method of manufacturing a photomask, the method including obtaining design data of a mask pattern to be formed on a substrate; obtaining data of a position error of a pattern occurring when the substrate is exposed to an exposure beam according to the design data; correcting position data of the pattern based on the position error data to compensate for the position error; and exposing the substrate according to the corrected position data of the pattern.

The embodiments may be realized by providing a method of manufacturing a photomask, the method including obtaining design pattern data of the photomask; obtaining data of a position error of a pattern occurring during an actual exposure; defining a grid to divide a mask region of the design pattern into a predetermined size; rearranging a position of the design pattern on the grid by compensating for the position error data; and exposing a substrate according to the position data of the design pattern.

BRIEF DESCRIPTION OF THE DRAWINGS

Features will be apparent to those of skill in the art by describing in detail exemplary embodiments with reference to the attached drawings in which:

FIG. 2 illustrates a block diagram of the apparatus in FIG. 1.

DETAILED DESCRIPTION

Figure 1:
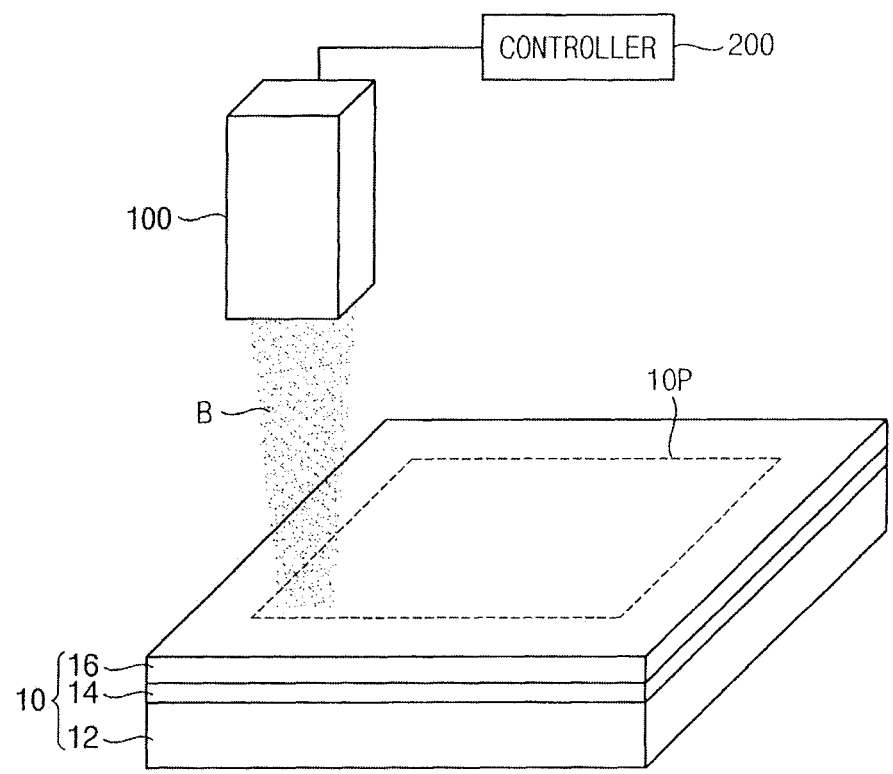
FIG. 1 illustrates a view of an apparatus of manufacturing a photomask in accordance with example embodiments.
Figure 3A:
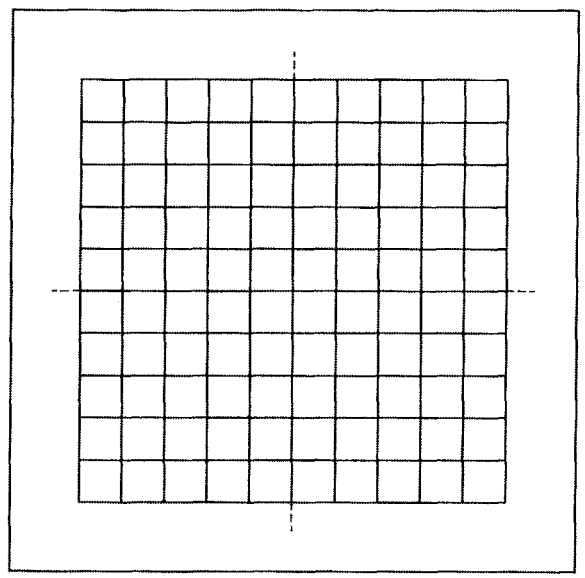
FIG. 3A illustrates a view of an ideal registration map of a mask pattern.
Figure 3B:
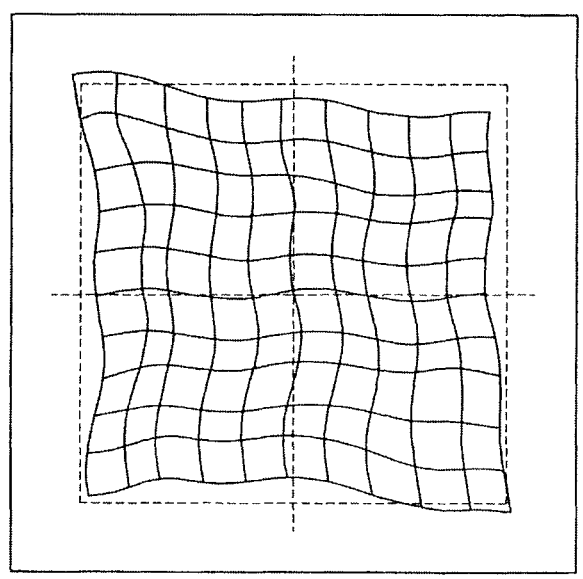
FIG. 3B illustrates a view of an actual registration map of a mask pattern.

FIG. 1 illustrates a view of an apparatus of manufacturing a photomask in accordance with example embodiments. FIG. 2 illustrates a block diagram of the apparatus in FIG. 1. FIG. 3A illustrates a view of an ideal registration map of a mask pattern. FIG. 3B illustrates a view of an actual registration map of a mask pattern.

Referring to FIGS. 1 to 3B, a photomask manufacturing apparatus may include an exposure device 100 and a controller 200 configured to control the exposure device 100. The exposure device 100 may expose a substrate 10 with an exposure beam according to a control signal based on a design data provided in the controller 200.

In an implementation, the exposure device 100 may generate a pattern on the substrate 10 using at least one exposure beam B. The exposure device 100 may be a micro-lithographic writing device for writing on a substrate having a photosensitive material deposited thereon. The exposure device 100 may be used to manufacture a photomask or reticle for a lithography process of a wafer. For example, the exposure beam B may include a laser beam, an electron beam, etc. (e.g., the exposure device 100 may be a laser beam emitter, an electron beam emitter, etc.). The exposure device 100 may include a scanning device that directs the exposure beam B towards the substrate 10 on an exposure stage and performs scanning operations.

The exposure device 100 may include a deflector used for the scanning operations. The deflector may deflect the exposure beam onto the substrate to form patterns. The exposure stage may support and move the substrate. The exposure stage may move along X direction or Y direction by actuators.

The substrate 10 may include, e.g., a blank mask substrate 12, a light shielding layer 14 and a photosensitive layer 16 sequentially stacked on one another. The blank mask substrate 12 may be, e.g., a transparent substrate, a reflecting substrate, or an absorbing substrate. For example, the blank mask substrate 12 may include glass or quartz. The light shielding layer 14 may include a metal layer, e.g., a chromium layer. The substrate 10 may be used as a photomask or reticle for a lithography process of a wafer. The exposure device 100 may expose the photosensitive layer 16 on the substrate 10 with the exposure beam B according to the design data to form a photoresist pattern.

When the substrate 10 is exposed to the exposure beam according to the design data, the photoresist pattern may have a position error (e.g., registration error) with respect to the design data due to properties of the exposure device itself or a scattering phenomenon or the like.

As illustrated in FIG. 3A, when the registration error is zero, an ideal registration map 50 of a mask pattern may be obtained. In this case, a photomask pattern, e.g., the photosensitive pattern, may be formed to have the same shape in the same position as a mask pattern of the design data. However, the photomask pattern may have a registration error in a local or entire region due to the position error of the pattern occurring during a photomask manufacturing process.

As illustrated in FIG. 3B, an actual registration map 52 may have an irregular registration error. The photomask pattern on the substrate 10 may have a registration error of a (+) or (−) shifted amount in X direction or Y direction.

The registration error may be a position error occurring due to properties of the exposure device itself (e.g., a property of the exposure stage, the property of the deflector, etc.) or a position error occurring due to a charging effect by a pattern density difference.

In an implementation, the controller 200 may correct the inputted design data using data of the position error, and may output a control signal for controlling the exposure device 100 to expose the substrate 10 with the exposure beam according to the corrected design data. As illustrated in FIG. 2, the controller 200 may include a data receiver 210, a data corrector 220, and an output 230.

The data receiver 210 may receive design pattern data from, e.g., a CAD system. For example, the design pattern data may be design data of a pattern to be formed in the photomask and may be represented by a coordinate value of a profile of the pattern. The design pattern data may be provided by a combination of polygons (triangles, rectangles, etc.). In the design pattern data, a plurality of sub-patterns having polygonal shapes may form one pattern. The design pattern data may include information about sizes and positions of the sub-patterns.

The data receiver 210 may receive data of a position error of the pattern. For example, the data receiver 210 may receive the position error data from a registration tool 300. The registration tool 300 may measure a position error of the pattern formed by an actual exposure to provide the position error data.

The position error data of the pattern may include a plurality of position error elements. In an implementation, the position error data may include, e.g., a position error element due to or caused by the exposure device and/or a position error element caused by pattern density.

For example, the position error element caused by the exposure device may include a position error element caused by the exposure stage, the deflector, the scanning device, etc. For example, the position error element caused by the exposure device may be a position error that occurs due to properties of the exposure device itself such as a property of the exposure stage, a property of the deflector, etc.

The position error element caused by the pattern density may be a charging effect error occurring when an electron beam is distorted greatly due to a scattering phenomenon as a region exposed to the electron beam increases.

In an implementation, the data receiver 210 may receive information about a plurality of position error elements and weights for the error elements, which may be determined by a user. In an implementation, the data receiver 210 may determine a plurality of position error elements and weights for the error elements according to a predetermined recipe.

The data corrector 220 may correct the position data of the pattern based on the position error data.

For example, a grid may be defined to divide a mask region of the mask pattern into a desired size, and the position of the mask pattern may be rearranged on the grid by reflecting or accounting for the position error data. In an implementation, the grid may have the size of several to tens of nanometers. The position of the pattern may be rearranged under an effect of the weights for the error elements.

In an implementation, a first region and a second region of the mask region may be divided into a first grid region having a first size and a second grid region having a second size different from the first size. The position of the pattern may be rearranged on the first and second grid regions having different resolutions.

The output 230 may output the corrected design data and output a control signal for controlling the exposure device 100 according to the corrected design data. The exposure device 100 may expose the substrate 10 with the exposure beam according to the control signal.

The corrected design data may be the final result of the design process for manufacturing the photomask. The corrected design data may be referred to as a mask tape out (MTO). The exposure device 100 may expose the substrate 10 with the exposure beam according to the corrected design data.

Hereinafter, a method of manufacturing a photomask using the photomask manufacturing apparatus in FIG. 1 will be explained.

Figure 4:
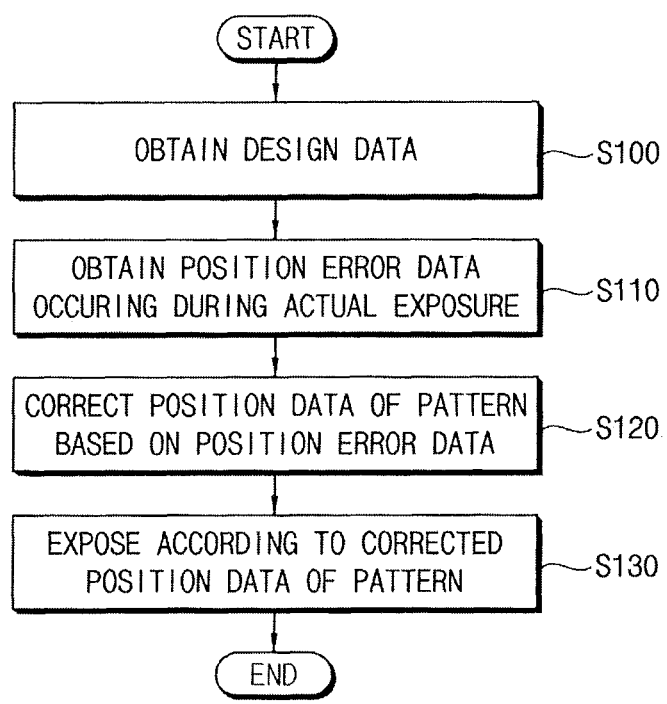
FIG. 4 illustrates a flow chart of a method of manufacturing a photomask in accordance with example embodiments.
Figure 5:
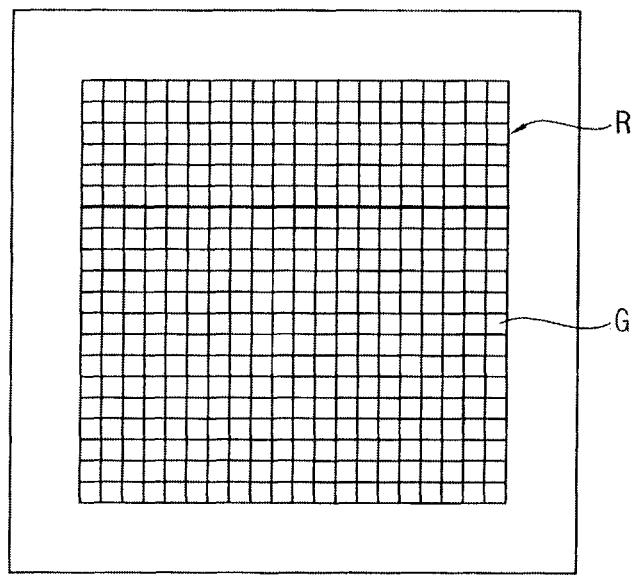
FIGS. 5 and 6 illustrate views of a grid dividing a mask region of a design mask pattern in accordance with example embodiments.
Figure 6:
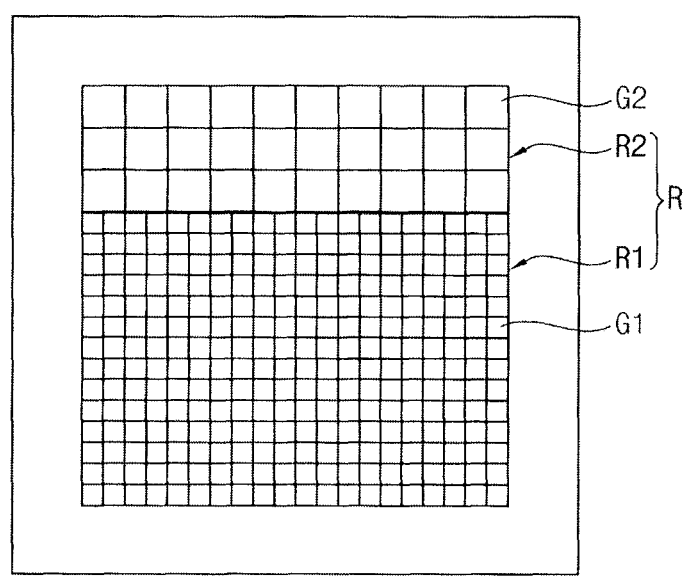
Figure 7:
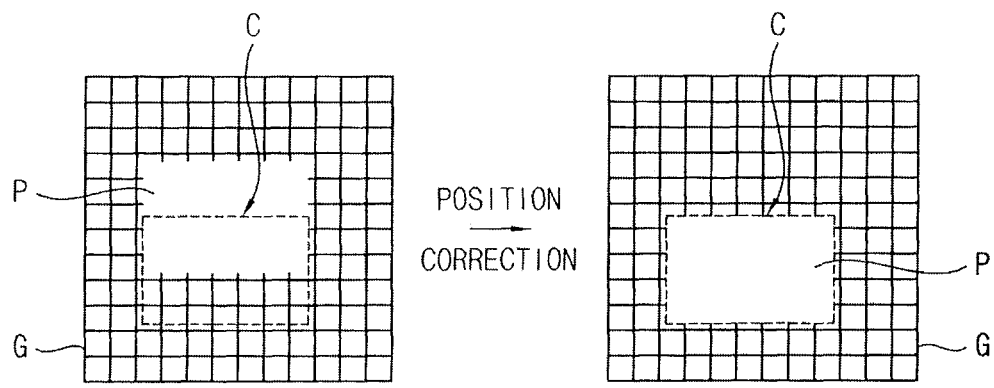
FIG. 7 illustrates a view of a stage of correcting position data of the design mask pattern.
Figure 8:
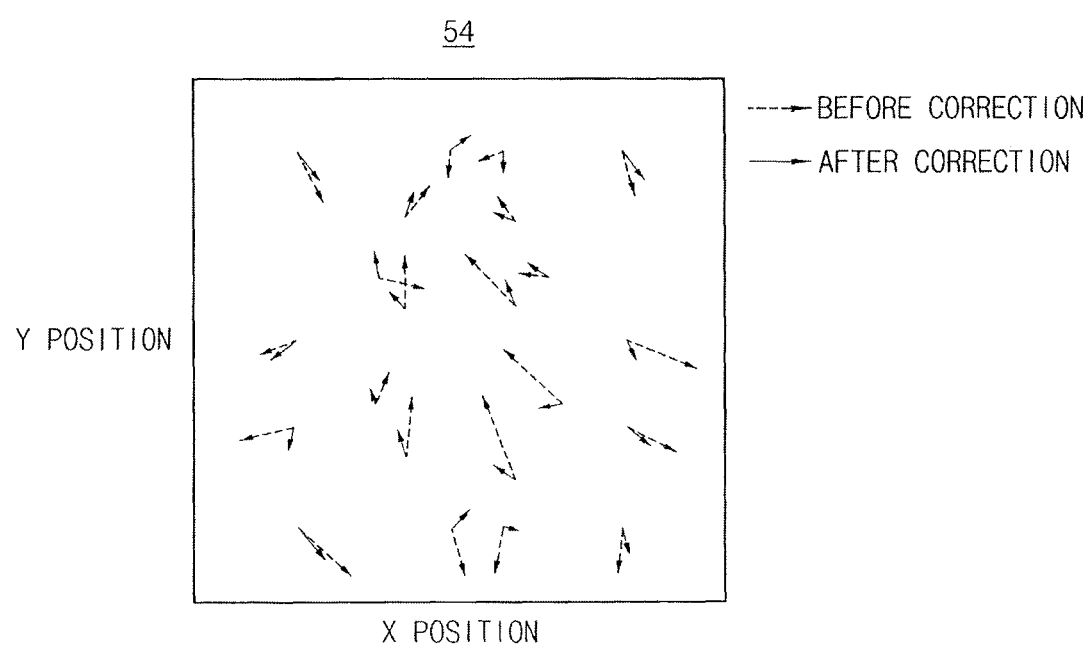
FIG. 8 illustrates a view of a registration map of the mask patterns respectively formed by the design mask pattern and the corrected mask pattern.

FIG. 4 illustrates a flow chart of a method of manufacturing a photomask in accordance with example embodiments. FIGS. 5 and 6 illustrate views of a grid dividing a mask region of a design mask pattern in accordance with example embodiments. FIG. 7 illustrates a view of a stage of correcting position data of the design mask pattern. FIG. 8 illustrates a view of a registration map of the mask patterns respectively formed by the design mask pattern and the corrected mask pattern.

In a method of manufacturing a photomask in accordance with example embodiments, after a layout of a photomask is designed, a substrate may be exposed by an exposure beam according to the designed layout to manufacture the photomask.

Referring to FIGS. 1, 2 and 4, first, in first step 100, a design data of a mask pattern may be obtained.

A layout of the mask pattern corresponding to an actual circuit pattern to be formed on a substrate 10 may be provided from, e.g., a host computer or server of a semiconductor manufacturing apparatus. For example, the design data of the mask pattern may be provided as a coordinate value of the profile of the pattern from a CAD system. The pattern data may be provided by a combination of polygons (triangles, rectangles, etc.).

In an implementation, the design pattern data may be provided as a corrected layout of the mask pattern on which an optical proximity correction (OPC) has been performed.

The optical proximity correction may include enlarging the whole size of the mask pattern and processing corners of the mask pattern. The optical proximity correction may include moving edges or adding extra polygons to each pattern. The optical proximity correction may be driven by pre-computed loop-up tables. In an implementation, the OPC may be driven by various suitable methods.

Then, in second step S110, a position error data of the pattern occurring or that would occur during an actual exposure process may be obtained.

In an implementation, the position error data may be obtained from the registration tool 300. The registration tool 300 may measure a position error of the pattern formed by an actual exposure to provide the position error data.

The position error data of the pattern may include a plurality of position error elements. For example, the position error data may include a position error element due to or caused by an exposure device and a position error element caused by a pattern density.

For example, the position error element caused by the exposure device may include a position error element caused by an exposure stage, a deflector, a scanning device, etc. For example, the position error element caused by the exposure device may be a position error occurring due to properties of the exposure device itself such as a property of the exposure stage, a property of the deflector, etc.

The position error element caused by the pattern density may be a charging effect error occurring when an electron beam is distorted (e.g., greatly) due to a scattering phenomenon as a region exposed to the electron beam increases (e.g., in density).

The position error data of the pattern may further include data of a position error in a step where the photomask is transferred to a wafer.

Then, in third step S120, in order to correct the design data, position data of the pattern may be corrected based on the position error data.

In an implementation, a mask region of the mask pattern may be divided into a grid having a desired size, and the position of the pattern may be rearranged on the grid based on the position error data.

As illustrated in FIG. 5, a mask region R of a mask design pattern L may be divided into a grid G having a predetermined size, and the mask pattern may be positioned on a coordinate frame of the grid G. For example, the grid G may have the size of several to tens of nanometers according to a selection of a user.

As illustrated in FIG. 6, a first region R1 of a mask region R may be divided into a first grid region having a first size, and a second region R2 of the mask region R may be divided into a second grid region having a second size different from the first size. The first region R1 of the mask pattern may be positioned on a coordinate frame of the first grid G1, and the second region R2 of the mask pattern may be positioned on a coordinate frame of the second grid G2.

Accordingly, a field correction or a global correction may be performed according to the grid region in the mask region R. The grid region may be determined to vary according to a density, size, etc. of the pattern.

As illustrated in FIG. 7, the position data of the mask design pattern P may be corrected on the coordinate frame of the grid G based on the position error data. The design pattern P may be rearranged to be shifted to a correction position C. A movement position of the pattern P may be determined to compensate for an error in each grid G. For example, a movement amount of a portion of the pattern P occupying a boundary of the grid G may be determined as one of values respectively designated to both grids sharing the boundary (e.g., the designated value may be determined based on the position error data).

The position error data of the pattern may include a plurality of the position error elements. The position correction of the design pattern P may be performed by considering at least one selected from the position error elements. In an implementation, weights for the selected error elements may be determined. Accordingly, the position of the design pattern P may be rearranged under an effect of the weights for the error elements.

The corrected design data may be the final result of the design process prepared for manufacturing the photomask. The corrected design data may be referred to as a mask tape out (MTO). The corrected design data may be provided to the exposure device 100 to perform an actual exposure process.

In here, before the corrected design data is provided to the exposure device, a verification process may be performed on the corrected design data. The verification process of the rearranged pattern may be performed according to a predetermined manufacture specification.

Then, in fourth step S130, the substrate 10 may be exposed according to the corrected position data of the pattern.

In an implementation, a photosensitive layer 16 on the substrate 10 may be exposed to an exposure beam according to the corrected design data to form a photosensitive pattern.

For example, a light shielding layer 14 and the photosensitive layer 16 may be formed sequentially on a mask substrate 12, and the photosensitive layer may be exposed to the exposure beam according to the corrected design data to form the photosensitive pattern. Then, the light shielding layer 14 may be patterned using the photosensitive pattern to form a mask pattern. The substrate 10 having the mask pattern formed thereon may be a photomask M for a lithography process of a wafer. For example, the blank mask substrate 12 may include glass or quartz. The light shielding layer 14 may include a metal layer, e.g., a chromium layer.

As illustrated in FIG. 8, a registration map 54 may represent registration error vectors in positions detected before and after correction of a design pattern data. An error vector of the photosensitive pattern formed according to the corrected design data may have a magnitude smaller than an error vector of the photosensitive pattern formed according to the original design data. For example, the registration error of the photosensitive pattern may be reduced by correction of the design data.

By way of summation and review, a registration error representing degree of precision of a pattern on the photomask may be an important quality factor directly connected to an overlay error. If a registration error were to occur on the photomask, and an exposure process is performed without correcting the registration error, a wafer overlay error could result, thereby causing a wafer defect.

As mentioned above, in a method of designing a layout of a photomask and a method of manufacturing a photomask, position error elements formed by an actual exposure may be reflected or compensated for to correct position data of a design pattern on a grid coordinate frame, to design a final layout of a mask pattern. An exposure process may be performed on the substrate according to the corrected design data to manufacture a photomask.

Accordingly, in a mask data preparation (MDP) step before proceeding to an exposure apparatus, a position correction process for each pattern and each region may be performed on a grid having a desired size in consideration of any possible error elements during an actual exposure process to thereby improve a correction consistency and productivity, and to secure a grid matching ability between exposure apparatuses to thereby improve overlay degrees of freedom.

In another method of correcting a position error of a pattern formed by an actual exposure, a position of a deflector of an exposure apparatus may be corrected in a designated position using a correction map, and there could be difficulties in a precise correction, an algorithm change, etc., due to limitations in equipment data processing.

A mask pattern manufactured by a method of designing a layout of a photomask and a method of manufacturing a photomask in accordance with example embodiments may be transferred to a wafer. For example, in order to form a circuit layer on the wafer, a photoresist layer may be deposited on the wafer, and a mask pattern of the photomask may be transferred to the photoresist layer by a photolithography process. Then, a developing process may be performed on the photoresist layer to form a photoresist pattern, and an etch process may be performed using the photoresist pattern to form a desired circuit pattern on the wafer.

The embodiments may provide a method of designing a layout of a photomask capable of transferring a circuit pattern on a substrate.

The embodiments may provide a method of designing a layout of a photomask capable of minimizing a position error of a pattern on the photomask.

The manufactured photomask may correspond to a respective patterned layer of a semiconductor device. Accordingly, a set of the photomasks corresponding to a plurality of the patterned layers which constitute the semiconductor device may be manufactured.

The semiconductor device manufactured by the set of photomasks may be used in various systems such as a computing system. The semiconductor device may include finFET, DRAM, VAND, etc. The system may be applied to a computer, a portable computer, a laptop computer, a personal portable terminal, a tablet, a cell phone, a digital music player, etc.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of designing a layout of a photomask, the method comprising:
    obtaining a design layout of a mask pattern;
    performing an optical proximity correction on the design layout to obtain design data;
    obtaining data of a position error of a pattern occurring during an exposure of the photomask according to the design data;
    correcting position data of the pattern based on the position error data to correct the design data; and
    providing the corrected position data to an exposure device to expose an exposure beam according to the corrected design data,
    wherein obtaining the data of the position error of the pattern includes obtaining a position error element caused by the exposure device and a position error element caused by a pattern density.

2. The method as claimed in claim 1, wherein obtaining the data of the position error of the pattern further includes:
    exposing a photosensitive layer on a substrate according to the design data to form a photosensitive pattern; and
    detecting a registration error from the photosensitive pattern.

3. The method as claimed in claim 1, wherein obtaining the data of the position error of the pattern further includes:
    determining a plurality of position error elements occurring during the exposure of the photomask; and
    detecting position errors of the determined position error elements.

4. The method as claimed in claim 3, wherein:
    obtaining the data of the position error of the pattern further includes generating weights for the determined position error elements, and
    correcting the design data includes correcting the position data of the pattern under an effect of the weights for the position error elements.

5. The method as claimed in claim 1, wherein the position error element caused by the exposure device includes a position error element caused by an exposure stage or a position error element caused by a deflector.

6. The method as claimed in claim 1, wherein obtaining the data of the position error of the pattern further includes obtaining data of a position error occurring when the photomask is transferred to a wafer.

7. The method as claimed in claim 1, wherein correcting the position data of the pattern based on the position error data includes:
    defining a grid to divide a mask region of the mask pattern into a desired size; and
    rearranging a position of the pattern on the grid by reflecting the position error data.

8. The method as claimed in claim 7, wherein defining the grid includes:
    dividing a first region of the mask region into a first grid region; and
    dividing a second region of the mask region into a second grid region.

9. The method as claimed in claim 8, wherein the first grid region has a grid of a first size and the second grid region has a grid of a second size different from the first size.

* * * * *